(12) United States Patent
Hwang et al.

(10) Patent No.: US 7,606,982 B2
(45) Date of Patent: Oct. 20, 2009

(54) MULTI-PATH ACCESSIBLE SEMICONDUCTOR MEMORY DEVICE HAVING DATA TRANSMISSION MODE BETWEEN PORTS

(75) Inventors: Hyong-Ryol Hwang, Seoul (KR); Sang-Kyun Park, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 176 days.

(21) Appl. No.: 11/466,406

(22) Filed: Aug. 22, 2006

(65) Prior Publication Data

US 2007/0150666 A1    Jun. 28, 2007

(30) Foreign Application Priority Data

Dec. 22, 2005    (KR) .................. 10-2005-0127528

(51) Int. Cl.
*G06F 12/00* (2006.01)
(52) U.S. Cl. .................. 711/147; 711/149; 365/230.05
(58) Field of Classification Search .............. 711/147, 711/149; 365/230.05
See application file for complete search history.

(56) References Cited

U.S. PATENT DOCUMENTS

| | | | |
|---|---|---|---|
| 4,164,787 A | | 8/1979 | Aranguren |
| 5,276,842 A | * | 1/1994 | Sugita .................. 711/149 |
| 5,740,398 A | * | 4/1998 | Quattromani et al. ........ 711/117 |
| 2002/0078311 A1 | | 6/2002 | Matsuzaki et al. |
| 2003/0093628 A1 | | 5/2003 | Matter et al. |
| 2003/0135699 A1 | * | 7/2003 | Matsuzaki et al. .......... 711/149 |
| 2004/0068614 A1 | * | 4/2004 | Rosenbluth et al. ......... 711/133 |
| 2004/0068633 A1 | * | 4/2004 | Engelahardt ................ 711/167 |
| 2005/0166007 A1 | * | 7/2005 | Ono .......................... 711/105 |

OTHER PUBLICATIONS

Welche Moglichkeiten bieten et al "Speicherkonfigureationen Mit Dual-Port-Srams", Design & Electronic, Aug. 19, Vom 13.09. 1998, pp. 123 and 125.

* cited by examiner

*Primary Examiner*—Christian P Chace
*Assistant Examiner*—Hashem Farrokh
(74) *Attorney, Agent, or Firm*—Marger Johnson & McCollom, P.C.

(57) ABSTRACT

A semiconductor memory device including a plurality of ports, at least one shared memory region of a memory cell array accessible through the ports, and a data transmission controller coupled to the shared memory region and the ports. The data transmission controller is configured to apply a read command of a read operation to the shared memory region after a write command of a write operation before applying any other commands to the shared memory region when at least a portion of a write address associated with the write operation and at least a portion of a read address associated with the read operation are substantially equivalent.

9 Claims, 14 Drawing Sheets

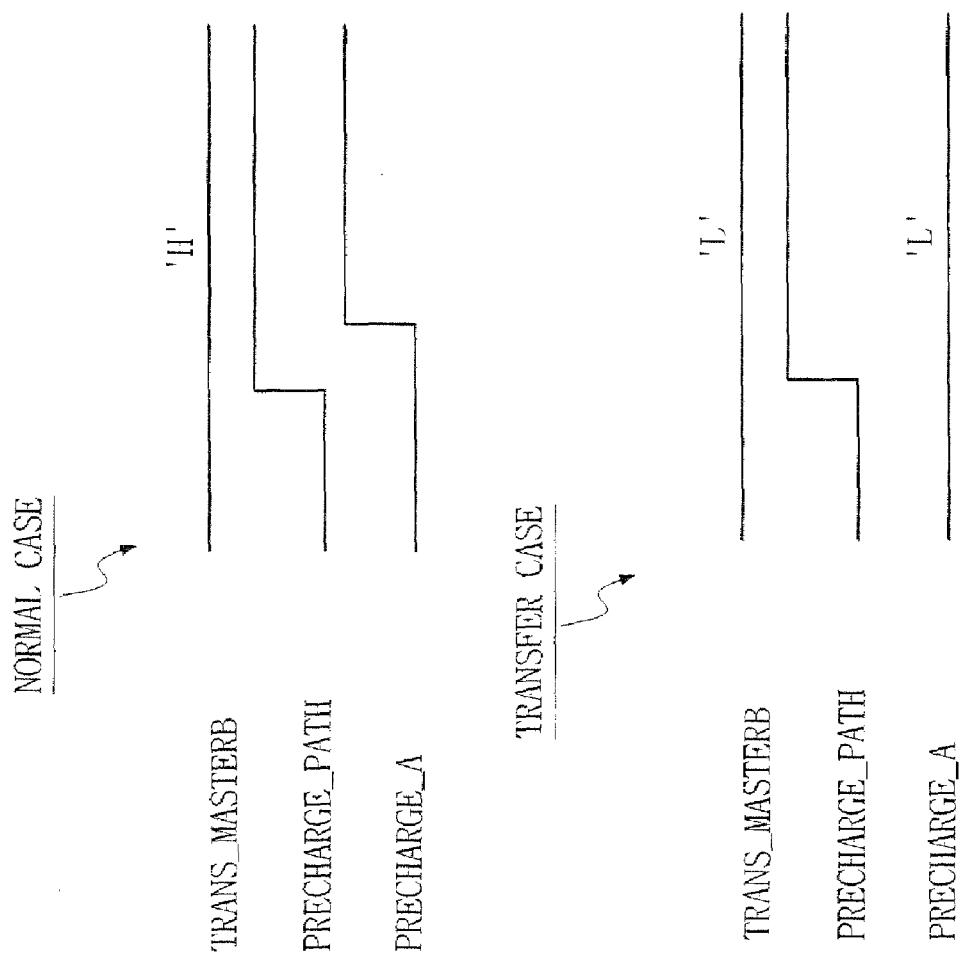

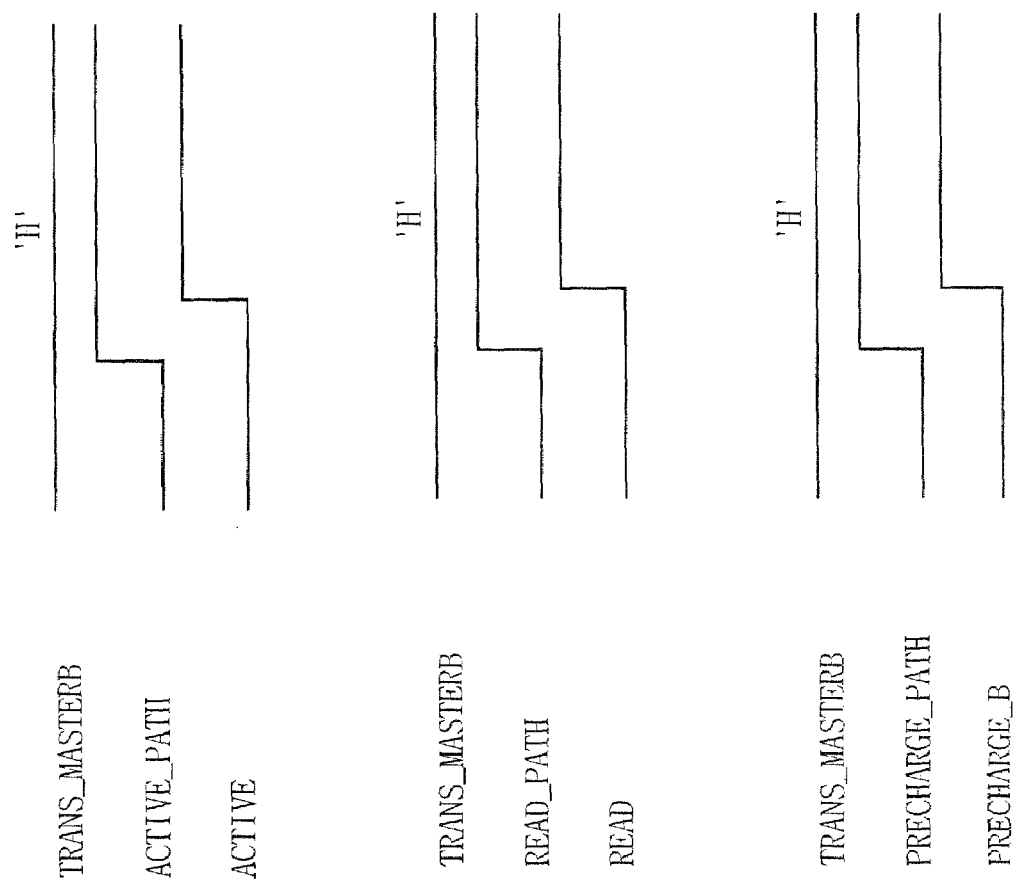

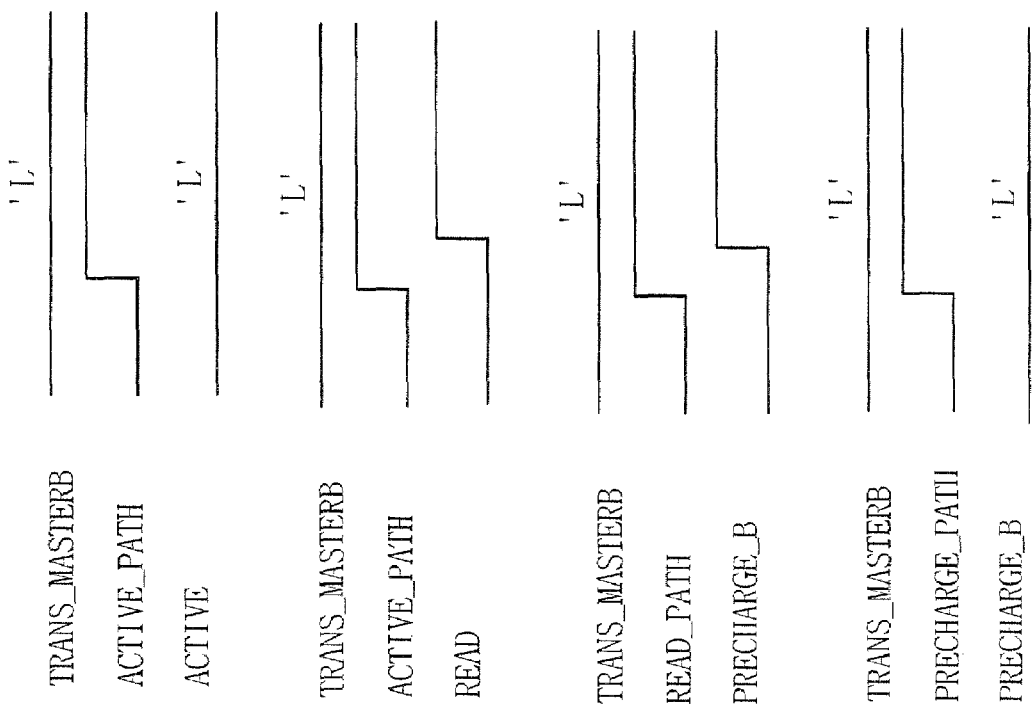

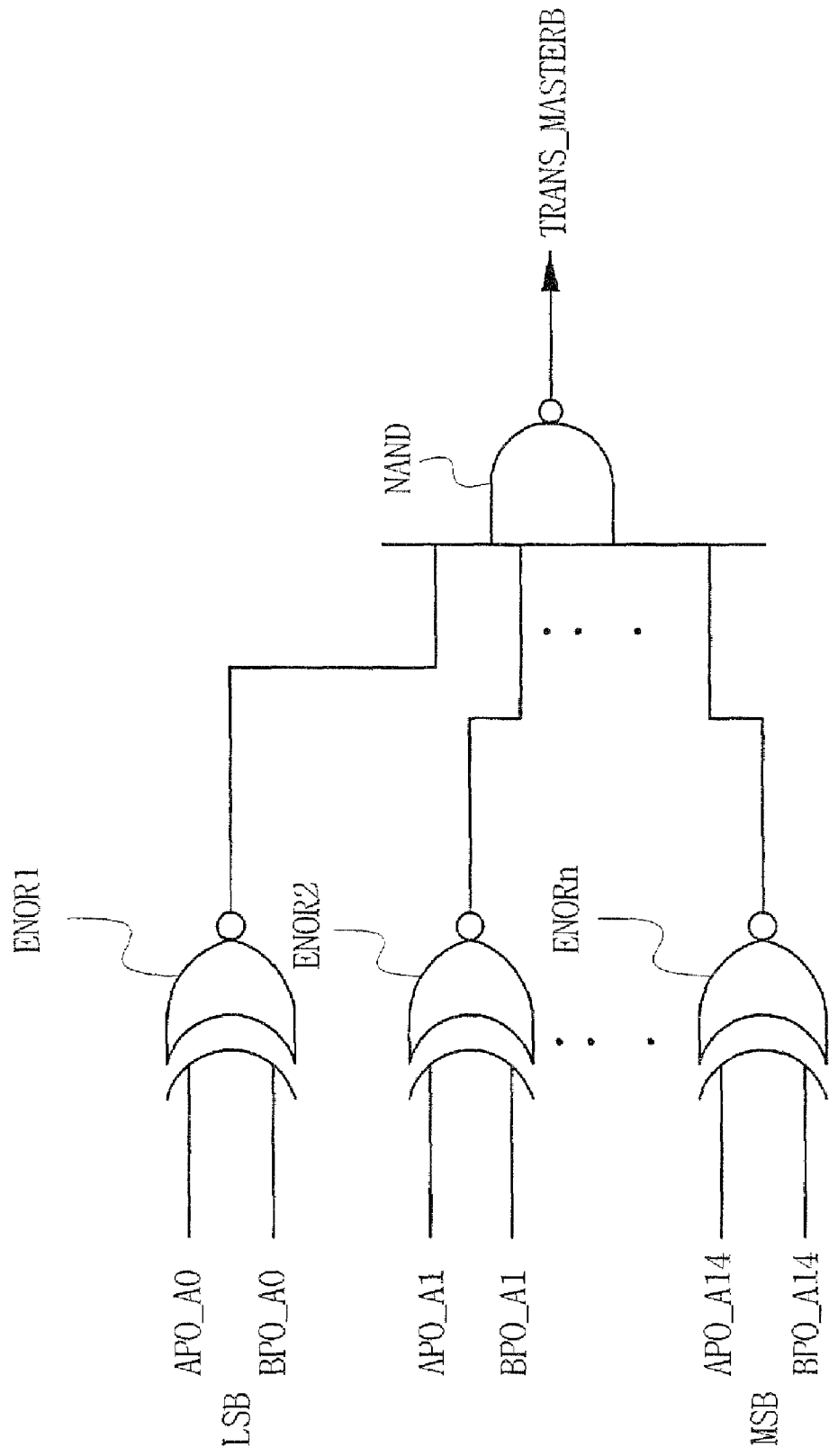

MULTI-PATH ACCESSIBLE SEMICONDUCTOR MEMORY DEVICE HAVING DATA TRANSMISSION MODE BETWEEN PORTS

CROSS-REFERENCE TO RELATED APPLICATION

This application claims the benefit of Korean Patent Application No. 2005-127528, filed Dec. 22, 2005, the disclosure of which is hereby incorporated herein by reference in its entirety.

BACKGROUND

1. Technical Field

This disclosure relates to a semiconductor memory device, and more particularly, to a multi path accessible semiconductor memory device for use in a portable communication system.

2. Description of the Related Art

In general, a semiconductor memory device having multiple access ports is called a multi port memory, and in particular, a memory device having two access ports is called a dual port memory. A typical dual port memory is an image processing video memory having a RAM (Random Access Memory) port accessible by a random sequence and an SAM port accessible only by a serial sequence.

Today, electronic systems are becoming ubiquitous in human life. For example, handheld phone or PDA (Personal Digital Assistant), etc., manufacturers have been produced multi processor systems having multiple processors as shown in FIG. 1 so as to obtain high speed functionality and smooth system operation.

Referring to FIG. 1, a first processor 10 is connected to a second processor 26 through a connection line L10. A NOR memory 14 and a DRAM 40 are connected to the first processor 10 through buses B1-B3. A DRAM 18 and a NAND memory 20 are connected to the second processor 26 through determined buses B4-B6. The first processor 10 may have a base band processing function or may perform a modulation and/or demodulation of communication signal. The second processor 26 may have an application function of processing communication data or performing play activity known as a game, etc. The NOR memory 14 has a NOR structure cell array configuration and the NAND memory 20 has a NAND structure cell array configuration. Both are nonvolatile memories having transistor memory cells that have floating gates, and are equipped to preserve and store data that should not be lost if power is removed. For example, such data includes device specific code of handheld instruments or configuration data. The DRAMs 40 and 18 function as main memories of processing data of processors 10 and 26.

However, in a multi processor system as shown in FIG. 1, DRAMs are each allocated to each processor. In addition, an interface, such as a UART (Universal Asynchronous Receiver/Transmitter), SPI (Serial Peripheral Interface), and SRAM (Static Random Access Memory), having a relatively low speed are used to access the DRAMs. Thus, it is difficult to obtain a satisfactory data transmission speed and complexity due to size is increased. Furthermore, cost increases because of configuring the memories. In addition, data needed by both processors 10 and 26 is transmitted through a data transmission channel L12, adding a delay of data transmission.

A scheme to reduce an occupied size, increase a transmission speed and reduce the employed number of memories is shown in FIG. 2. In FIG. 2, one DRAM 42 is connected with first and second processors 10 and 26 through buses B1 and B2, in contrast to the system of FIG. 1. In the structure of multi processor system of FIG. 2, to access to one DRAM 42 by both processors through two respective paths, two ports are required on the DRAM to be connected corresponding to the buses B1 and B2.

However, a DRAM according to a conventional art is a memory 1 having a single port PO as shown in FIG. 3. FIG. 3 illustrating a conventional structure of DRAM, a memory cell array includes first to fourth banks 3, 4, 5 and 6 each having a row decoder and a column decoder. An upper input/output sense amplifier and driver 13 is operatively connected to first bank 3 or third bank 5 through a multiplexer 11, 12. A lower input/output sense amplifier and driver 15 is operatively connected to a second bank 4 or fourth bank 6 through a multiplexer 13 or 28.

For example, when a memory cell within the first bank 3 is selected and data stored in the selected memory cell is read, an output operation of the read data is described as follows. First, a selected word line is activated, then data of a memory cell sensed and amplified by a bit line sense amplifier is transferred to a local input/output line pair 9 by an activation of corresponding column selection line CSL. Data transferred to the local input/output line pair 9 is transferred to a global input/output line pair 10 by a switching operation of first multiplexer 21. The second multiplexer 11, connected to a global input/output line pair 10, transfers data of the global input/output line pair 10 to the upper input/output sense amplifier and driver 13. Data sensed and amplified by the input/output sense amplifier and driver 13 is output to a data output line L5 through a path part 16.

However, when data stored in a memory cell of the fourth bank 6 is read, the data is output to an output terminal DQ, sequentially passing through multiplexer 24, multiplexer 28, lower input/output sense amplifier and driver 15, path part 16 and data output line L5. That is, DRAM of FIG. 3 has the structure that two banks share an input/output sense amplifier and driver, and is a single port memory in which the input/output of data is performed through one port PO. The DRAM 1 of FIG. 3 can be used in the system of FIG. 1, but it may be difficult or impossible to use in the multi processor system referred to in FIG. 2.

Referring to FIG. 4, illustrating a multi processor system 50, a memory array 35 is constructed of first, second and third portions. The first portion 33 of the memory array 35 is accessible only by a first processor 70 through a port 37. The second portion 31 is accessible only by a second processor 80 through a port 38. The third portion 32 is accessible by both of the first and second processors 70 and 80. The size of first and second portions 33 and 31 of the memory array 35 can be variously changed according to an operating load of the first and second processors 70 and 80. Furthermore, the memory array 35 may be a memory type or disk storage type.

To realize third portion 32 shared by the first and second processors 70 and 80 within the memory array 35 in the structure of DRAM, several difficulties arise. For example, a layout of memory regions and input/output sense amplifiers within the memory array 35, and a proper read/write path control technique require attention. In the read/write operation through respective ports an operating time interval must be shortened to obtain efficient port use permissions and a high data transmission speed.

As a result, there remains a need for an improved method and apparatus for sharing a shared memory region allocated within a DRAM memory cell array in a multi processor system having two or more processors, and to enable transmission of data between ports.

SUMMARY

An embodiment includes a semiconductor memory device including a plurality of ports, at least one shared memory region of a memory cell array accessible through the ports, and a data transmission controller coupled to the shared memory region and the ports. The data transmission controller is configured to apply a read command of a read operation to the shared memory region after a write command of a write operation before applying any other commands to the shared memory region when at least a portion of a write address associated with the write operation and at least a portion of a read address associated with the read operation are substantially equivalent.

Another embodiment includes a system for a semiconductor memory device including a shared memory region of the semiconductor memory device accessible through multiple ports, a data transmission controller coupled to the shared memory region and configured to generate a transfer signal by comparing a first address associated with a first access to the shared memory region through a first one of the ports with a second address associated with a second access to the shared memory region through a second one of the ports, a first processor coupled to the data transmission controller, and including a first command generator configured to generate a first set of commands in response to the transfer signal, and a second processor coupled to the data transmission controller, and including a second command generator configured to generate a second set of commands in response to the transfer signal.

Another embodiment includes a method of operating a semiconductor memory device including receiving write operation commands through a first port, receiving read operation commands through a second port, applying a write command of the write operation commands to a portion of a shared memory region, and applying a read command of the read operation commands to the portion of the shared memory region after applying the write command and before applying any other commands to the portion of the shared memory region.

Another embodiment includes a method of operating a semiconductor memory device including receiving write operation commands associated with a write operation through a first port, receiving read operation commands associated with a read operation through a second port, and performing the write operation and the read operation on a shared memory region of the semiconductor memory device using a subset of the write operation commands and the read operation commands.

BRIEF DESCRIPTION OF THE DRAWINGS

The above and other features will become readily apparent from the description that follows, with reference to the attached drawings in which:

FIGS. 11 to 13 illustrate timings of signals shown in FIG. 10; and

FIG. 14 illustrates in detail an address comparator used in processors according to an embodiment.

DETAILED DESCRIPTION

Embodiments of the invention are more fully described in detail with reference to FIGS. 5 to 14. Embodiments may take many different forms and should not be construed as being limited to the embodiments set forth herein. Rather, these embodiments are provided so that this disclosure is thorough and complete, and to convey the concept of the following claims to those skilled in the art.

Other examples, published methods, procedures, and general dynamic random access memories and circuits will not be described in detail in the following description, in order to prevent confusion.

A dynamic random access memory may not have a SAM port, but may include a common memory region accessible through multiple access ports. To distinguish between the dynamic random access memory and the multi port memory described above, the dynamic random access memory will be herein called a multi-path accessible semiconductor memory device, though it will be more definitely described in the following description.

A multi-path accessible semiconductor memory device for use in a multi processor system according to embodiments will be described referring to the accompanied drawings.

Figure 5:
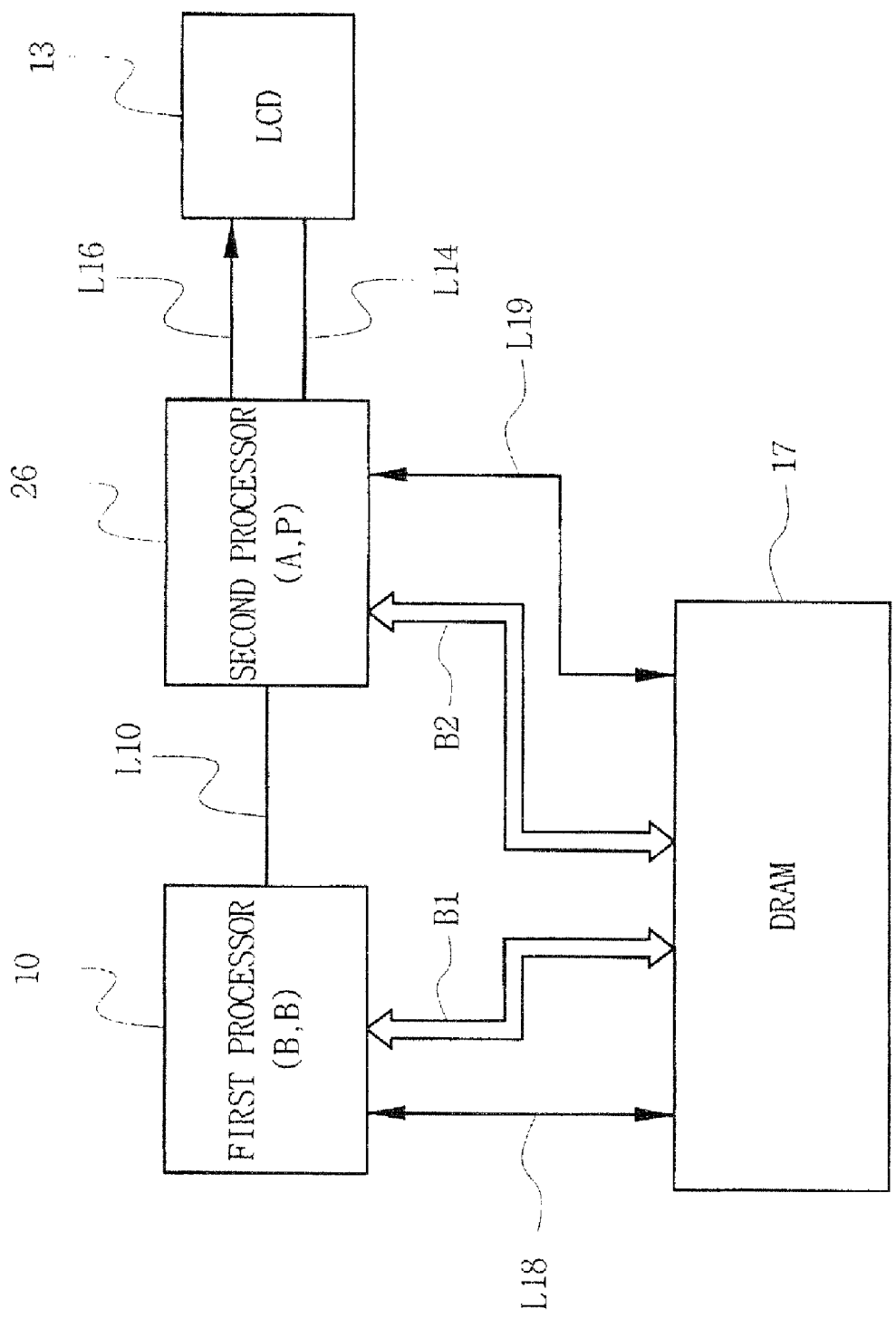
FIG. 5 is a block diagram of multi processor system having a multi path accessible DRAM according to an embodiment.

FIG. 5 is a block diagram of multi processor system having a multi path accessible DRAM according to an embodiment. With reference to FIG. 5, a multiprocessor system may include a first processor 10 for performing a first determined task, a second processor 26 for performing a second determined task, and a DRAM (dynamic random access memory) 17 having a shared memory region within a memory cell array accessible by the first and second processors 10 and 26. The portable communication system may include a liquid crystal display (LCD) 13 connected to the second processor 26 through a connection line L14. Although an LCD 13 has been illustrated in FIG. 5, other types of displays, including cathode ray tube (CRT) displays, plasma displays, or the like may be used as a display 13.

The DRAM 17 shown in FIG. 5 may include independent ports A and B. However, even though two ports A and B are described, any number of ports may be used. Assuming that the port A is called herein a first port, the first port is coupled to the first processor 10 through a system bus B1. Assuming that the port B is called herein a second port, the second port is coupled to the second processor 26 through a system bus B2. The first processor 10 may have processing capabilities such as a MODEM function, performing a modulation and/or demodulation of communication signal, or a base band processing function. The second processor 26 may have processing capabilities such as an application function of processing communication data or providing entertainment such as a game, video, and the like. Although particular processing capabilities have been described separately for each processor, any processor may have any combination of such processing capabilities.

In one embodiment, the system bus B1 may have 16 bits. The system bus B2 may have either 16 bits or 32 bits (×16, ×32). However, the bus width for busses B1 and B2 may be any width, as desired. In addition, the width of bus B1 need not be the same as the width of bus B2.

The DRAM 17 having a dual port may be used to store data and commands for an execution by processors 10 and 26. The DRAM 17 may have independent input/output paths per port so the processing tasks of the processors 10 and 26 may be performed more smoothly. Consequently, in the multiprocessor system of FIG. 5, a memory cell array having a shared memory region is used, thus a data transmission channel L12 between processors 10 and 26 shown in FIG. 1 may be removed.

The system of FIG. 5 may be a portable computing device or a portable communication device. For example, such devices include cellular phones, bi-directional radio communication system, single directional pager, bi-directional pager, personal communication system, portable computer, and the like.

In the system of FIG. 5, the number of processors may be greater than two. The processors of the system may be a microprocessor, CPU, digital signal processor, micro controller, reduced-command set computer, complex command set computer, or the like. Furthermore, any number and type of processors may be used in any combination.

An example of a layout relationship of a shared memory region in DRAM 17 shown in FIG. 5 and an access operation of the processors 10 and 26 will be described in detail referring to the drawings illustrating the interior of memory device.

Figure 6:
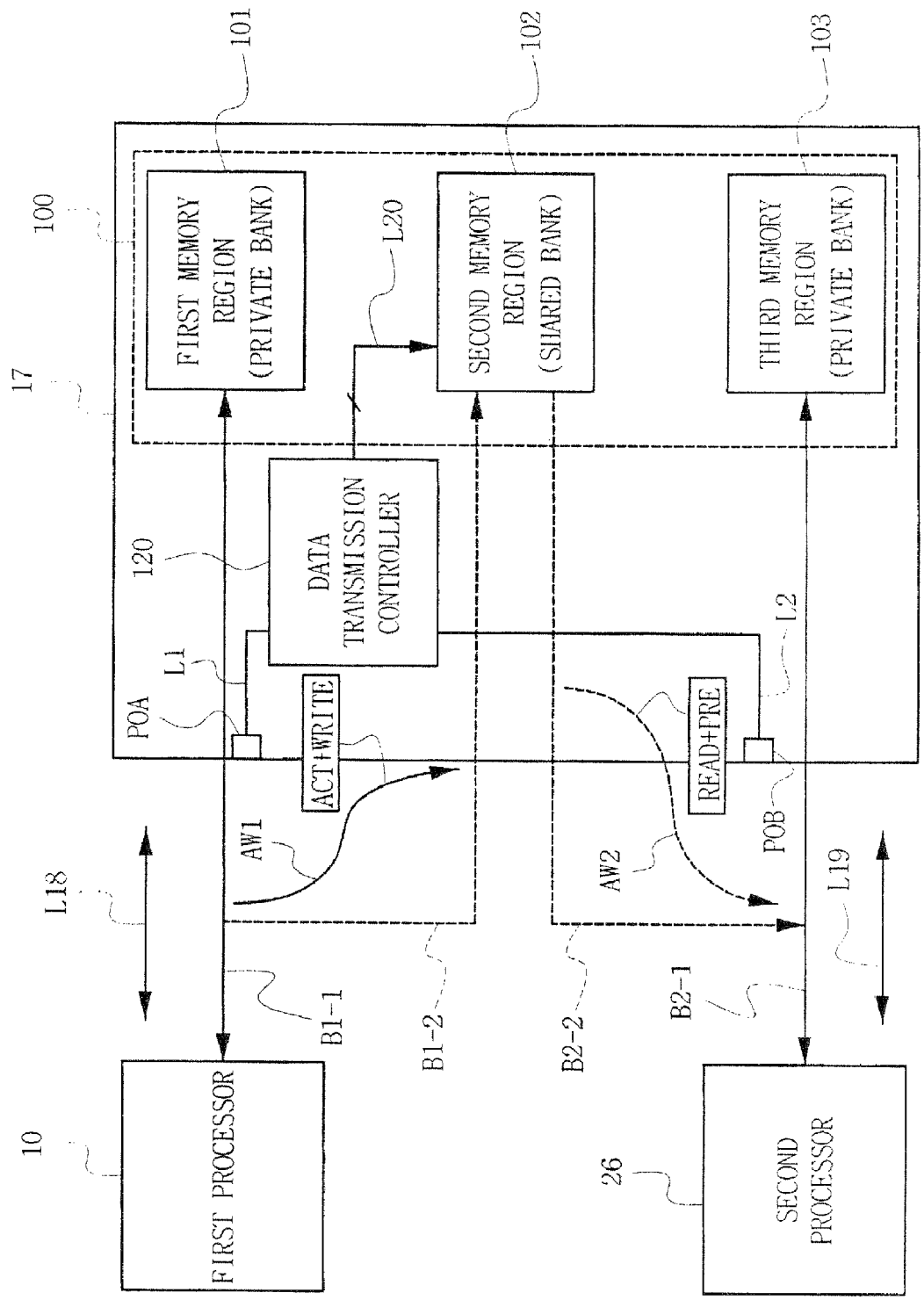
FIG. 6 is a block diagram illustrating a layout of memory regions and ports in a multi path accessible DRAM shown in FIG. 5.

FIG. 6 is a block diagram illustrating a layout of memory regions and ports in a multi path accessible DRAM shown in FIG. 5. As shown in FIG. 6, three memory regions 101-103 are disposed within a memory cell array 100. In the layout structure of FIG. 6, a first memory region 101 is accessible by first processor 10 through first port POA, and a third memory region 103 is accessible by second processor 26 through second port POB, and a second memory region 102 is accessible by all of the first and second processors 10 and 26 through respective first and second ports POA and POB.

The second memory region 102 is a shared memory region. The first and third memory regions 101 and 103 are private memory regions accessible by the first and second processors 10 and 26, respectively. Three memory regions 101-103 may be individually configured as a bank unit of a DRAM. One bank may have a storage capacity of 64 Mbit, 128 Mbit, 256 Mbit, 512 Mbit, or 1024 Mbit, for example. The memory cells within a bank may be disposed in a matrix type of rows and columns. The memory cells may be DRAM memory cells including an access transistor and a storage capacitor.

In FIG. 6, for example, when the first processor 10 accesses the second memory region 102 through the first port POA, the second processor 26 may access another memory region such as the third memory region 103 through the second port POB. Such access by the second processor 26 may be substantially simultaneous. Such multi-path access operation may be performed by appropriately controlling an input/output path through the ports.

In FIG. 6, the layout of one shared memory region 102 and two ports was shown. However, there may be any number of ports. For example, the number of ports may correspond to the number of processors. In addition, there may be more than one shared memory region commonly accessible by multiple processors. Furthermore, each processor may, but need not have access to every shared memory region. For example, if there are three processors A, B, and C, and a first and a second shared memory region, processors A and B may have access to the first shared memory region, while processors B and C have access to the second shared memory region.

Figure 1:
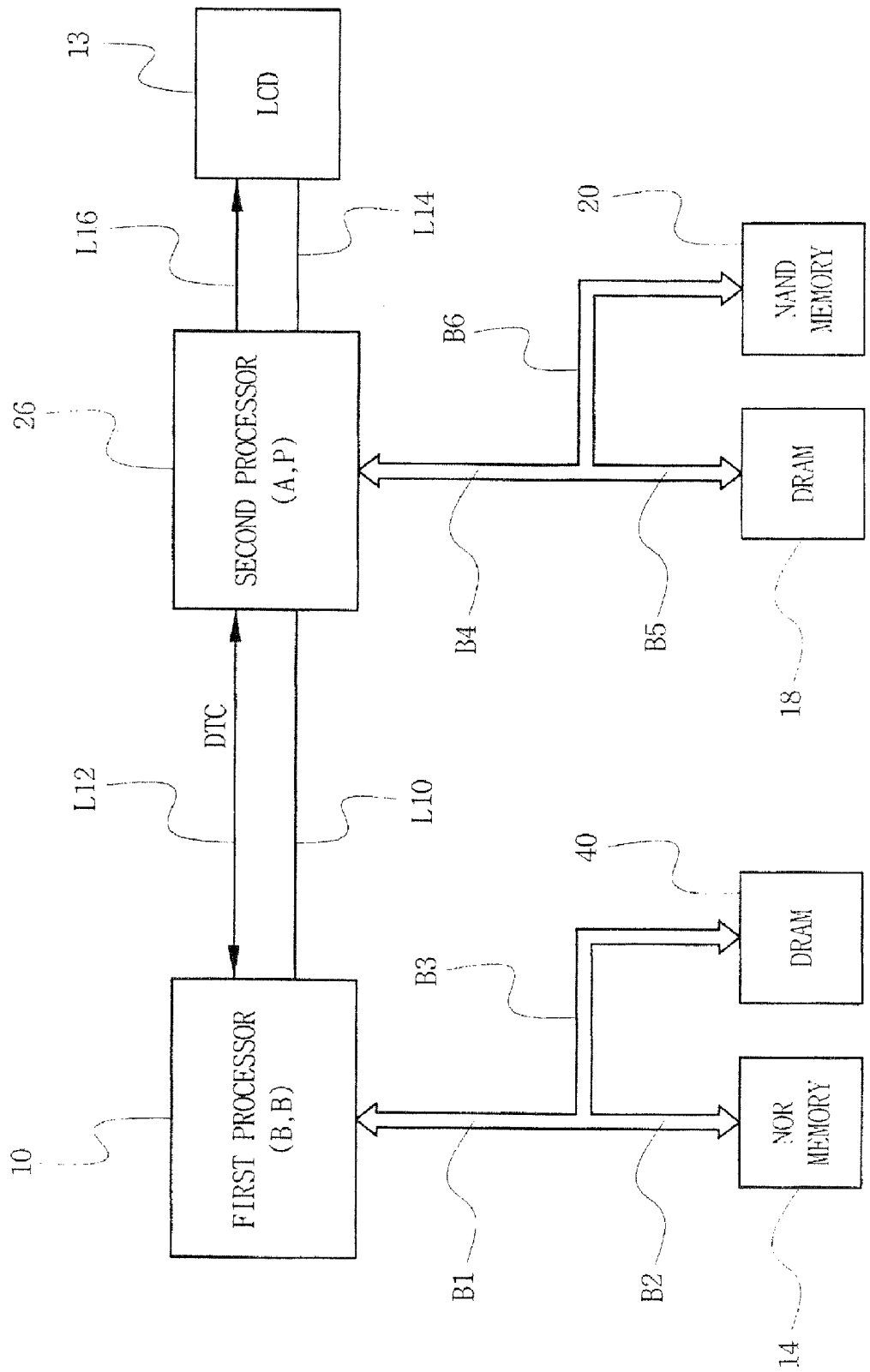
FIG. 1 is a block diagram of a conventional multi processor system for use in a portable communication device.
Figure 2:
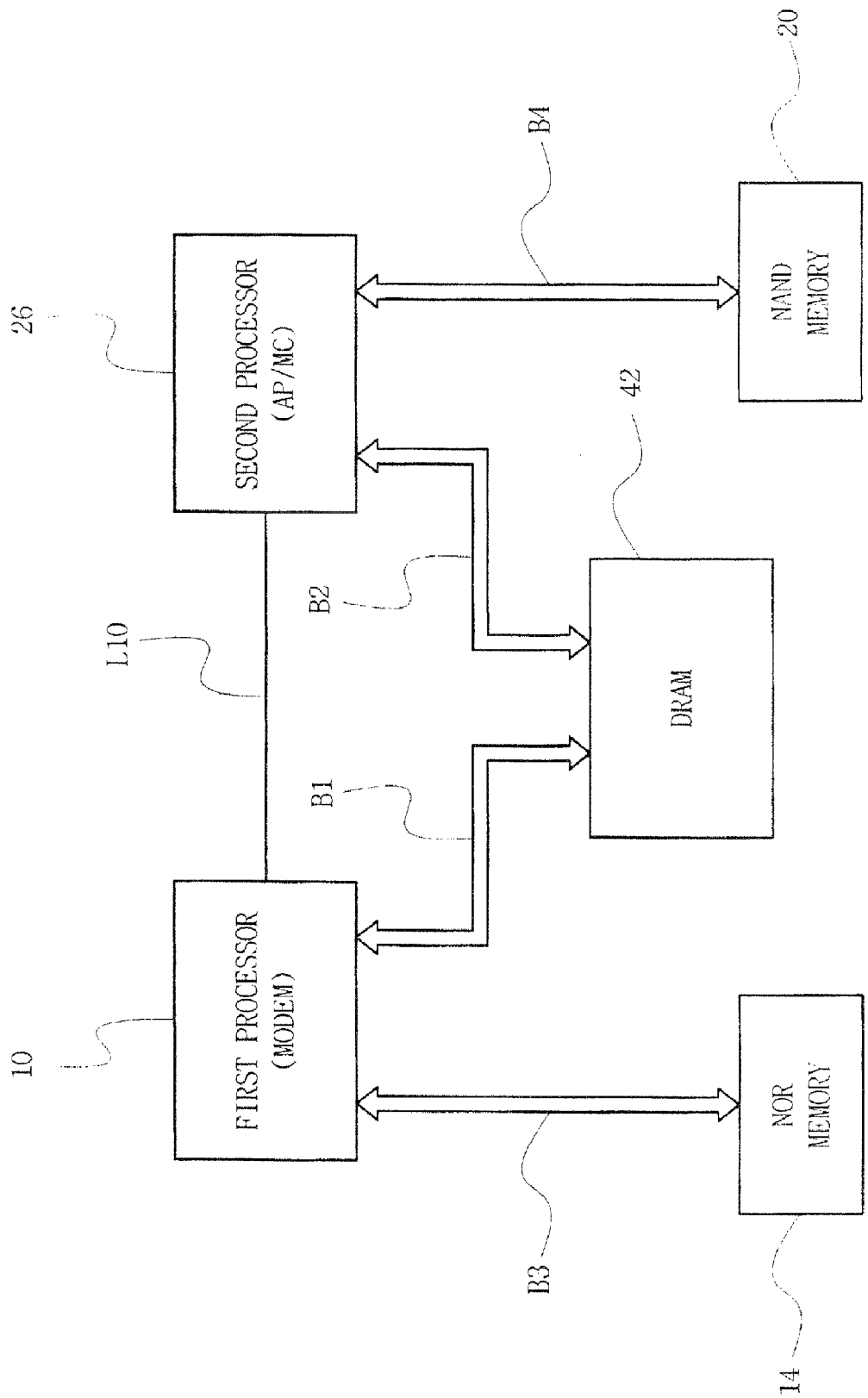
FIG. 2 is a block diagram illustrating an example of a conventional multi processor system capable of using a memory according to an embodiment.
Figure 3:
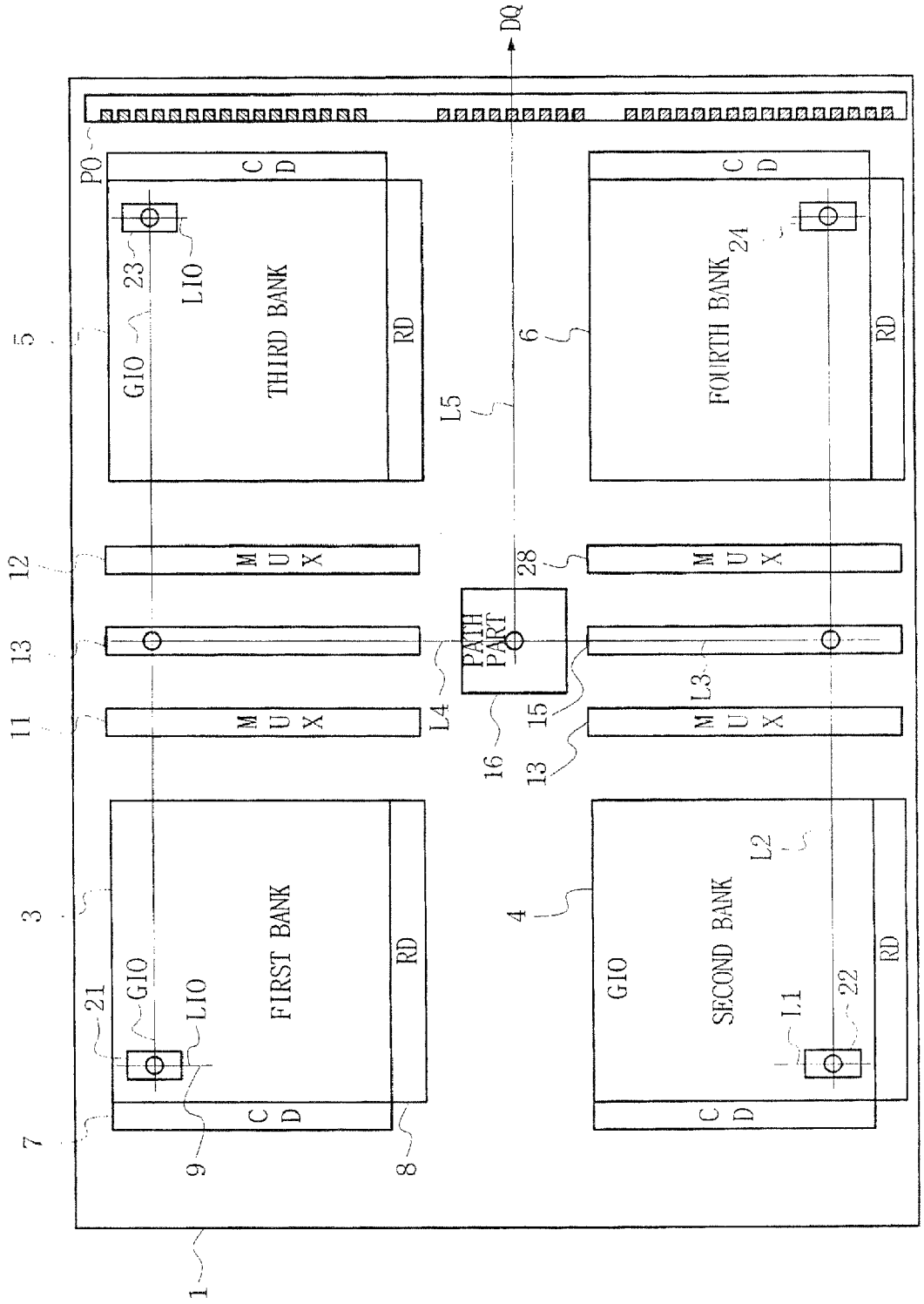
FIG. 3 is a block diagram illustrating an internal structure of a conventional memory cell array of a DRAM.
Figure 4:
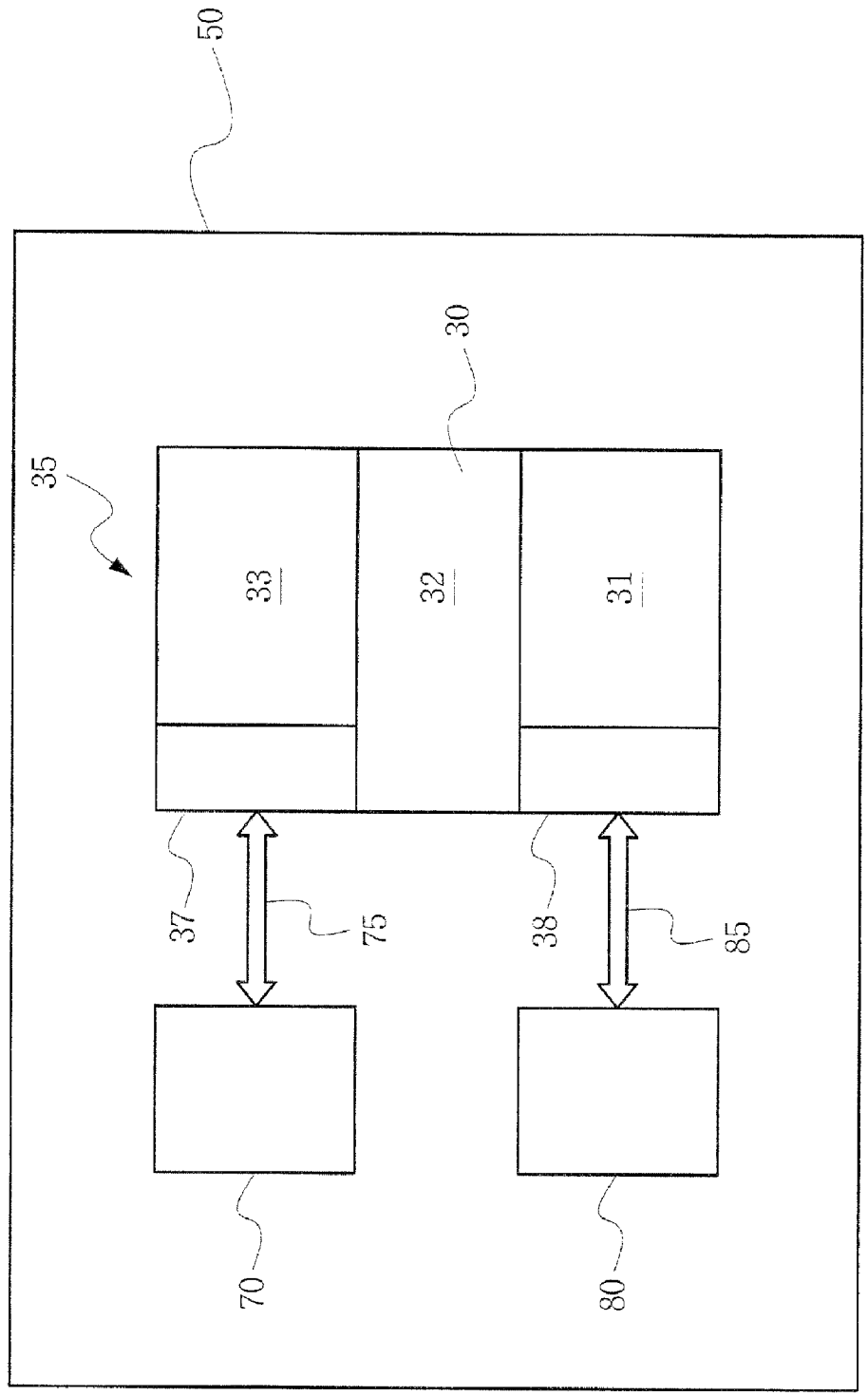
FIG. 4 is a block diagram illustrating memory array portions of a conventional multi processor system.

As described above, when a shared memory region within a memory cell array can be smoothly accessed by multiple processors, data transmission channel L12 of FIG. 1 may be removed. Any data transmission between processors may be performed through shared memory region 102. For example, an access request of first processor 10 to second memory region 102, such as a data write request, enters through first port POA. Then an access request of second processor 26 to the second memory region 102, such as a data read request, enters through second port POB. In this case, the processor that first attempted to access has priority for access to the second memory region 102. Thus, the first processor 10 has priority. After the write related operations for a specific memory cell of second memory region 102 is completed by an access request of the first processor 10, the second processor 26 may access the second memory region 102 and perform a read operation of reading out data of a specific memory cell of the second memory region 102. A write operating mode may include an active time interval for writing, an actual data write time interval, and a precharge time interval after the writing. A read operating mode may include an active time interval for reading, an actual data read time interval, and a precharge time interval after the reading.

In this example, processors are attempting to access the same row address through different ports using a write operating mode and a read operating mode. If a write operation is performed through one occupied port, then a read command may be immediately applied through another port without a precharge after the write operation and an applied active command before the read operation. As a result, a data transmission time can be substantially reduced.

In FIG. 6, when processors 10 and 26 attempt to access a shared memory region using the same row address through different ports POA and POB, a sequential write operation and a read operation are used. A data transmission controller 120 performs a write operation through one port POA, and then performs a data reading by immediately applying a read command through another port POB without a precharging and applying an active command. In FIG. 6, a reference character of arrow AW1 indicates active and write in first port POA, and an arrow AW2 indicates read and precharge in second port POB. Time intervals of precharge and active command are omitted by a control function of the data transmission controller 120 as shown in FIG. 7.

Figure 7:
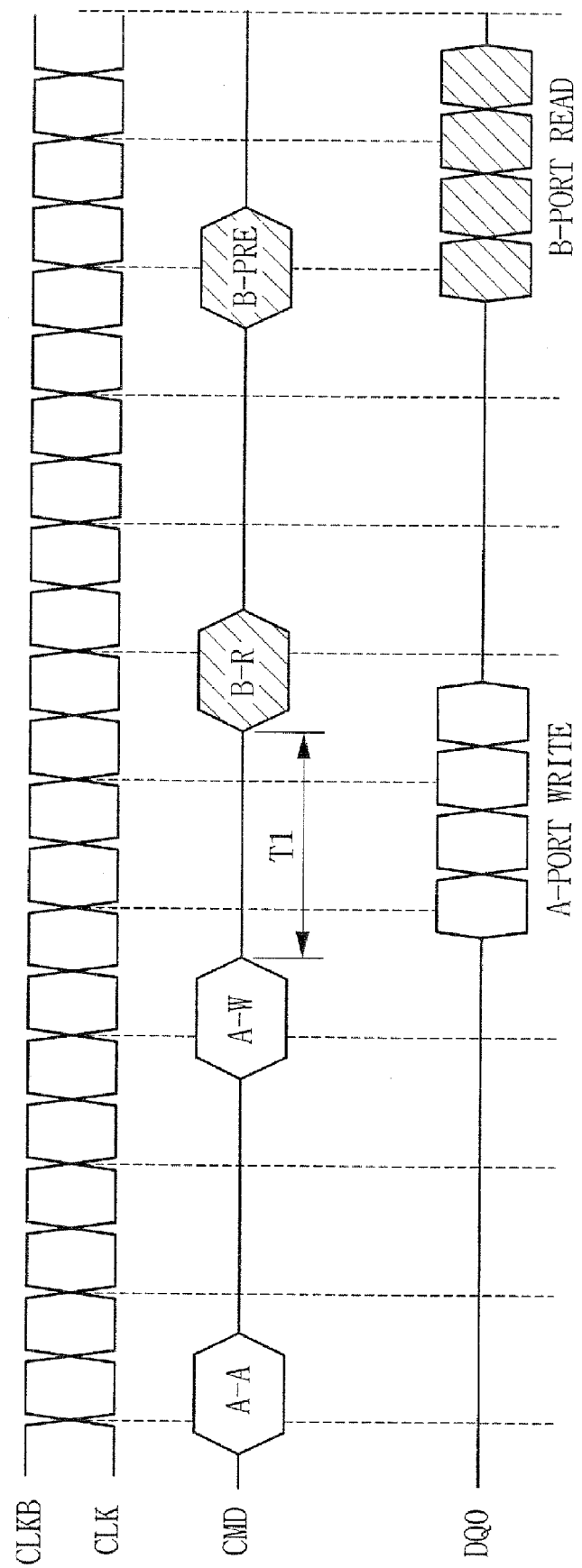
FIG. 7 is a timing diagram for write and read operations of FIG. 6.

FIG. 7 is a timing diagram for write and read operations of FIG. 6. A signal waveform A-A of command CMD indicates an active command applied interval in the first port POA. A signal waveform A-W indicates a write command applied interval in the first port POA. A signal waveform B-R designates a read command applied interval in the second port POB. A signal waveform B-PRE designates a precharge applied interval in the second port. Note that a precharge command applied interval of first port associated with the write operation and active command applied interval of second port associated with the read operation are not present during a time interval T1.

In another embodiment, the data transmission controller 120 may receive the commands associated with a write operation and a read operation. As described above, the data transmission controller 120 may omit the precharge and active commands. Thus, the data transmission controller 120 may apply a subset of the commands associated with a write operation and a read operation.

As described above, when several command applied intervals are removed between an write and a read operation, a data transmission speed between processors increases. Furthermore, one memory may be mounted on the system, thus decreasing the system size and a cost of memory in the system.

Figure 8:
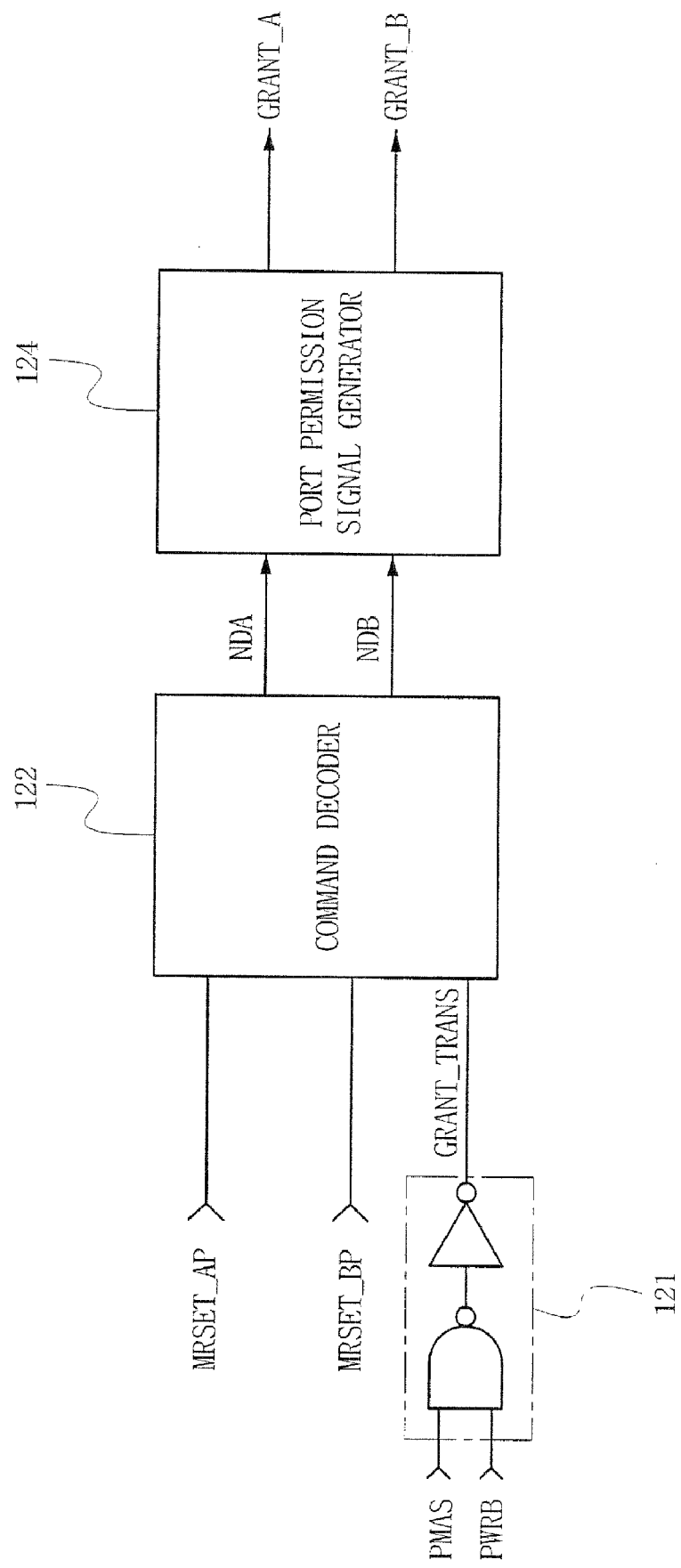
FIG. 8 is a block diagram illustrating in detail a data transmission controller of FIG. 6.

FIG. 8 is a block diagram illustrating in detail data transmission controller of FIG. 6. The data transmission controller may include a command decoder 122 for logically combining the external signals MRSE_AP, MRSET_BP and GRANT_TRANS, and generating port decoding signals NDA and NDB. In addition, the data transmission controller may include a port permission signal generator 124 for generating port permission signals GRANT_A and GRANT_B in response to the port decoding signals NDA and NDB.

The signals MRSET_AP and MRSET_BP are port occupation request signals generated by commands applied from processors. The signal GRANT_TRANS is generated by logically combining through a gating part 121 an active master signal PMAS provided by processors and a write completion signal PWRB informing of a write completion in the interior of DRAM. That is, when port permission signal GRANT_A is activated, a data access path (B1-2 of FIG. 6) is formed between one POA selected from ports and the shared memory region 102. Similarly, when port permission signal GRANT_B is activated, a data access path (B2-2 of FIG. 6) is formed between one POB selected from the ports and the shared memory region 102.

Through use of the data access path, input/output related circuits of respective ports may be formed. One input/output related circuit may be selected by a switching circuit. An input/output related circuit may include a data output path circuit and a data input path circuit. The data output path circuit may include an input/output sense amplifier, a data multiplexer coupled to the input/output sense amplifier, a data output buffer coupled to the data multiplexer, and a data output driver coupled to the data output buffer, for driving output data. The data input path circuit may include a data input buffer coupled to a port, a first input driver coupled to the data input buffer, for primarily driving write data, and a second input driver coupled to the first input driver, for secondarily driving the write data.

The processors may share a global input/output line pair of the shared memory region, a local input/output line pair coupled to the global input/output line pair, a bit line pair coupled to the local input/output line pair by a column selection signal, a bit line sense amplifier installed on the bit line pair, for sensing and amplifying data of bit line, and a memory cell coupled to an access transistor, the memory cell being formed on the bit line pair.

Figure 9:
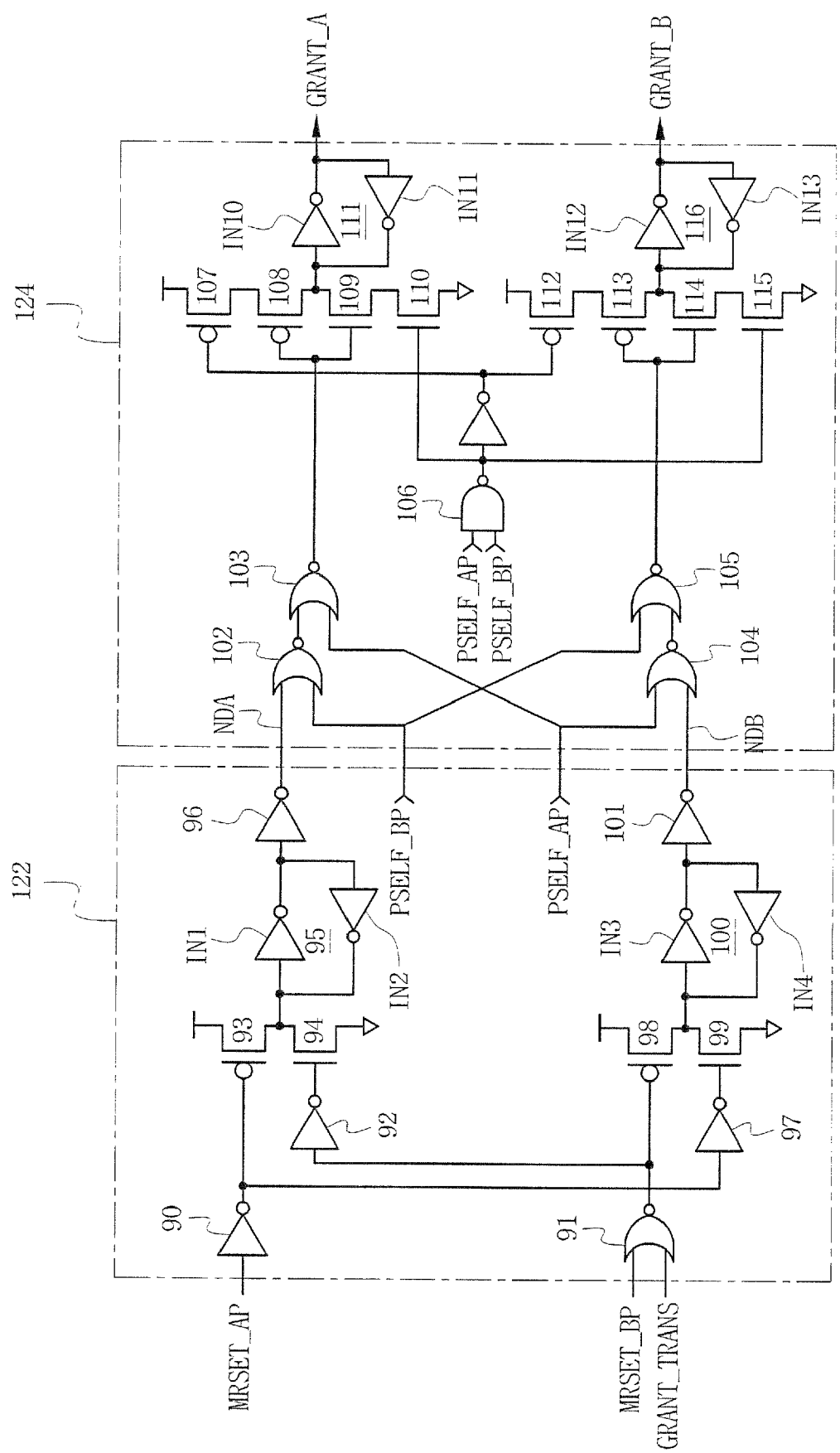
FIG. 9 is a circuit diagram of the data transmission controller shown in FIG. 8.

FIG. 9 is a circuit diagram of data transmission controller shown in FIG. 8. Circuit devices 90 and 91-101 have a wiring structure as shown in the left side of the drawing, forming command decoder 122. Circuit devices 102-116 have a wiring structure as shown in the right side of the drawing, forming port permission signal generator 124. Signals PSELF_AP and PSELF_BP applied to a NAND gate 106 within the port permission signal generator 124 may be provided from a processor of the system when a port permission is required.

Figure 10:
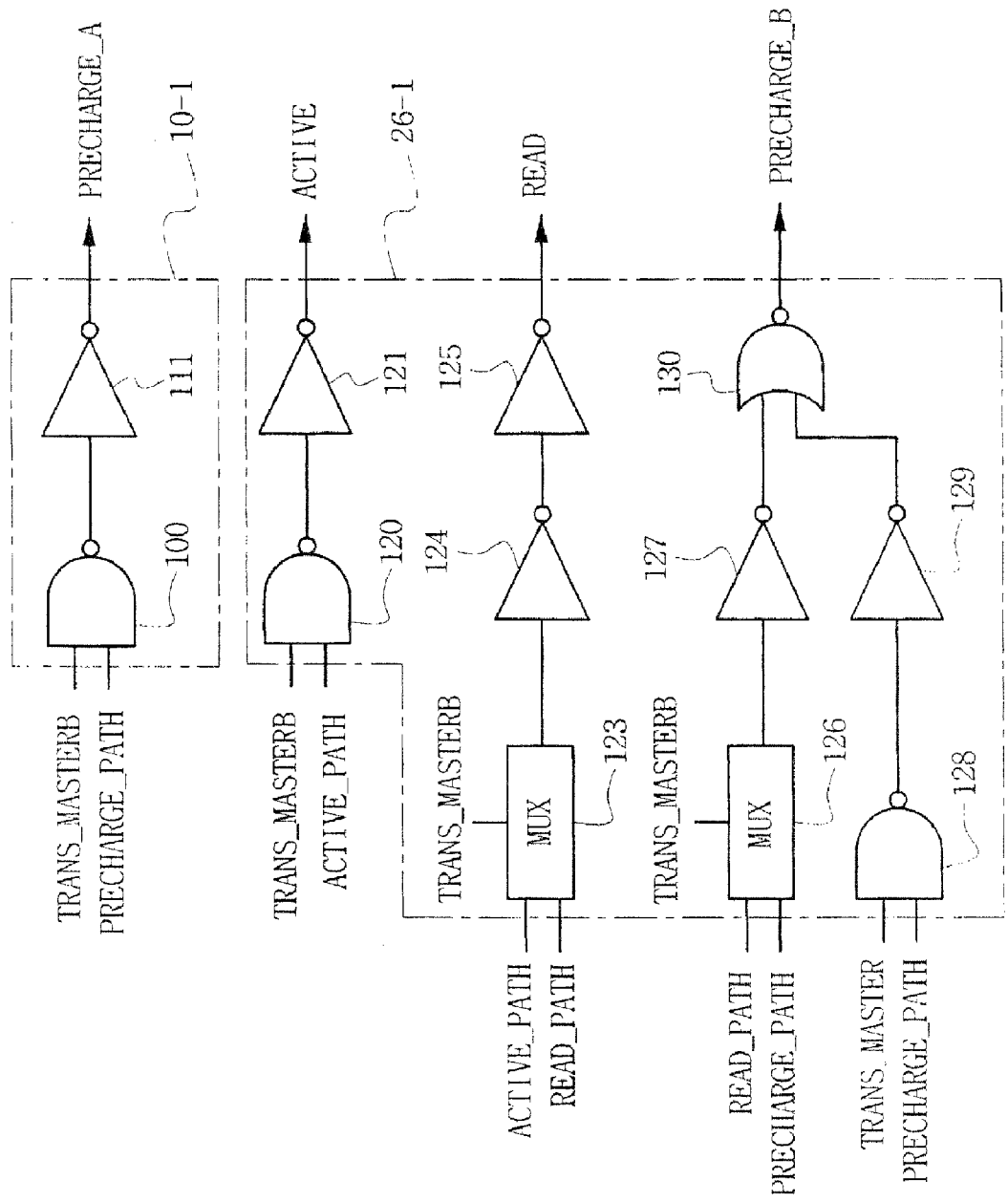
FIG. 10 is a circuit diagram schematically illustrating command generators employed in processors according to an embodiment.

FIG. 10 is a circuit diagram schematically illustrating command generators employed in processors according to an embodiment. In case that the first and second processors attempt to perform an access through mutually different ports and that a write operating mode and a read operating mode are sequentially required, a command generator 10-1 of the first processor 10 and a command generator 26-1 of the second processor 26 may be used.

The command generator 10-1 of the first processor 10 may include a NAND gate 100 and an inverter 111, to generate precharge command of the first port. The command generator 26-1 of the second processor 26 may include a NAND gate 120 and an inverter 121, for a generation of active command, a multiplexer 123 and inverters 124 and 125 for a generation of read command, and circuit devices 126-130 for a generation of precharge command.

FIGS. 11 to 13 illustrate timings of signals shown in FIG. 10.

Referring first to FIG. 11 illustrating timings for the command generation of command generator 10-1 in normal case. In both cases, both processors are attempting to access the second memory region 102, for example. The first processor is writing to the second memory region 102, and the second processor is reading from the second memory region 102. In the normal mode, the processors are accessing different row addresses. In the transfer mode, both processors are accessing the same row addresses.

In the normal case, PRECHARGE_A is activated, causing a precharge on the row address. However, since the second processor is accessing the same row address in the transfer case, a precharge is not needed. Thus, in the transfer case, PRECHARGE_A is not activated.

FIG. 12 illustrates timings for command generation operation of the command generator 26-1 in the normal case. In the normal case, the command generator 26-1 of the second processor 26 outputs a signal at an active logic high level. Thus, in the normal case, an active operation before a read operation occurs.

FIG. 13 illustrates timings for command generation operation of command generator 26-1 in a transfer case. In the transfer case, the command generator 26-1 of the second processor 26 outputs an active signal at a logic low level. Thus, in the transfer case, an active operation before a read operation is omitted. Furthermore, a read command is immediately applied through second port, and a read operation is executed as shown in FIG. 7. As a result, a data transmission rate between processors is increased.

FIG. 14 illustrates in detail an address comparator used in processors according to an embodiment. The address comparator may include multiple exclusive NOR gates ENOR1-ENORn and a NAND gate. Corresponding bits AP_Ax and BP0_Ax of respective processors, where x is a number indicating the weight of the bit in the row address, are compared with each other. The comparisons are combined in the NAND gate. Thus, a signal TRANS_MASTERB is generated corresponding to the comparison of the addresses. Using this signal, a decision is made whether or not row addresses of memory cell to be accessed through two ports are the same.

As described above, in a semiconductor memory device according to an embodiment, a write operation is performed through one port, and a read command is immediately applied through another port without a precharge after the write operation and an applied active command before a read operation. As a result, a data transmission time is substantially reduced.

As described above, in a semiconductor memory device according to an embodiment, a shared memory region allocated within a memory cell array can be smoothly accessed by multiple processors. Additionally, in a specific data transmission mode, a read operation is performed without precharging and an applied active command, thus a data transmission speed between processors increases. The size of the system becomes more compact, and a cost of memory in the system can be substantially reduced. Accordingly, a multi processor system using such memory access may have a competitive advantage.

In other embodiments, the configuration of banks or a circuit configuration in the interior of memory, and an access method, may be varied as desired.

In another embodiment, two of three memory regions may be shared memory regions and the remaining one memory region is designated as a private memory region. Alternatively, all of three memory regions may be shared memory regions. Furthermore, three or more processors may be used in the system. As a result, three or more ports may be installed in one DRAM, where each of the three processors may access to the shared memories through a corresponding port.

In addition, although a DRAM was described in embodiments above, the data structure is not limited to DRAMs. Embodiments may include other types of memory structures, such as a static random access memory, nonvolatile memory, flash memory, and the like, for example.

It will be apparent to those skilled in the art that modifications and variations can be made without deviating from the spirit or scope as defined by the following claims. Thus, it is intended that any such modifications and variations are within the scope of the appended claims and their equivalents.

The invention claimed is:

1. A semiconductor memory device, comprising:
   a plurality of ports;
   at least one shared memory region of a memory cell array accessible through the ports; and
   a data transmission controller coupled to the shared memory region and the ports, wherein the data transmission controller is configured to apply a read command of a plurality of read operation commands received through a first one of the ports in association with a read operation to the shared memory region after a write command of a plurality of write operation commands received through a second one of the ports in association with a write operation before applying any other commands associated with the read operation and the write operation to the shared memory region when at least a portion of a write address associated with the write operation and at least a portion of a read address associated with the read operation are substantially equivalent;
   wherein the data transmission controller comprises:
      a command decoder coupled to the ports and configured to combine signals received through the ports associated with the read operation and the write operation and configured to generate a port decoding signal; and
      a port permission signal generator coupled to the command decoder and configured to generate a port permission signal in response to the port decoding signal;
      wherein the data transmission controller is further configured to apply the read command after the write command before applying any other commands to the shared memory region in response to the port permission signal.

2. The semiconductor memory device of claim 1, wherein the data transmission controller is further configured to apply the read command after applying the write command without applying a precharge command of the write operation commands and an active command of the read operation commands.

3. The semiconductor memory device of claim 1, wherein the portion of the write address and the portion of the read address that are substantially equivalent each include a common row address.

4. The semiconductor memory device of claim 1, further comprising:
   an address comparator coupled to the ports and configured to compare the at least the portion of the write address and the at least the portion of the read address to generate a transfer signal;
   wherein the data transmission controller is further configured to apply the read command after the write command without applying a precharge command of the write operation commands and an active command of the read operation commands in response to the transfer signal.

5. The semiconductor memory device of claim 1, wherein the data transmission controller is further configured to apply the read command after the write command before applying any other commands associated with the read operation and the write operation when at least one command associated with the write operation is received before any commands associated with the read operation.

6. The semiconductor memory device of claim 5, wherein the data transmission controller is further configured to apply the read command after the write command before applying any other commands associated with the read operation and the write operation when at least one command associated with the read operation is received before a final command associated with the write operation is applied.

7. A system for a semiconductor memory device, comprising:
   a shared memory region of the semiconductor memory device accessible through a plurality of ports;
   a data transmission controller coupled to the shared memory region and configured to generate a transfer signal by comparing a first address associated with a first access to the shared memory region through a first one of the ports with a second address associated with a second access to the shared memory region through a second one of the ports;
   a first processor coupled to the data transmission controller, and including a first command generator configured to generate a first set of commands in response to the transfer signal; and
   a second processor coupled to the data transmission controller, and including a second command generator configured to generate a second set of commands in response to the transfer signal.

8. The system of claim 7, wherein if the transfer signal indicates that the first access and the second access are associated with the same address:
   the first command generator is further configured to generate the first set of commands including an active command and a write command without a following precharge command; and
   the second command generator is further configured to generate the second set of commands including a read command and a precharge command without a preceding active command.

9. A semiconductor memory device, comprising:
   a plurality of ports;
   at least one shared memory region of a memory cell array accessible through the ports; and
   a data transmission controller coupled to the shared memory region and the ports, wherein the data transmission controller is configured to apply a read command of a read operation to the shared memory region after a write command of a write operation before applying any other commands to the shared memory region when at least a portion of a write address associated with the write operation and at least a portion of a read address associated with the read operation are substantially equivalent;

wherein the data transmission controller comprises:
a command decoder coupled to the ports and configured to combine signals received through the ports associated with the read operation and the write operation and configured to generate a port decoding signal; and
a port permission signal generator coupled to the command decoder and configured to generate a port permission signal in response to the port decoding signal;

wherein the data transmission controller is further configured to apply the read command after the write command before applying any other commands to the shared memory region in response to the port permission signal.

* * * * *

UNITED STATES PATENT AND TRADEMARK OFFICE
CERTIFICATE OF CORRECTION

PATENT NO.       : 7,606,982 B2                                                       Page 1 of 1
APPLICATION NO.  : 11/466406
DATED            : October 20, 2009
INVENTOR(S)      : Hyong-Ryol Hwang et al.

It is certified that error appears in the above-identified patent and that said Letters Patent is hereby corrected as shown below:

Column 2, line 37, the word "DRAM" should read -- DRAM 1 --;
Column 7, line 17, the word "MRSE_AP" should read -- MRSET_AP --;
Column 8, line 47, the word "AP_Ax" should read -- AP0_Ax --.

Signed and Sealed this

Twenty-third Day of February, 2010

David J. Kappos
*Director of the United States Patent and Trademark Office*